(12) United States Patent
Chen et al.

(10) Patent No.: US 7,301,603 B2
(45) Date of Patent: Nov. 27, 2007

(54) EXPOSURE SYSTEM AND METHOD

(75) Inventors: Kai-Hsiung Chen, Taipei Hsien (TW);
Chun-Ming Hu, Hsinchu (TW);
Yung-Chih Chang, Fongshan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 756 days.

(21) Appl. No.: 10/876,104

(22) Filed: Jun. 24, 2004

(65) Prior Publication Data

US 2006/0008715 A1 Jan. 12, 2006

(51) Int. Cl.
*G03B 27/42* (2006.01)
*G03F 9/00* (2006.01)

(52) U.S. Cl. .......................... 355/53; 430/22

(58) Field of Classification Search ................. 355/53, 355/72, 75, 77; 430/30, 22; 356/399, 400, 356/401; 700/114
See application file for complete search history.

(56) References Cited

U.S. PATENT DOCUMENTS

2004/0157143 A1 * 8/2004 Taniguchi .................... 430/30

* cited by examiner

*Primary Examiner*—Peter B. Kim
(74) *Attorney, Agent, or Firm*—Thomas, Kayden, Horstemeyer & Risley

(57) ABSTRACT

An exposure system and method for use in an exposure tool. The system includes a compensation unit and an exposure unit. The compensation unit receives a fine-tuning value for an overlay correction parameter for a product in a first run. The compensation unit further receives an adjustment period for an exposure tool, an adjustment time for the exposure tool, and a process time for the product in a second run. The compensation unit also receives an equipment baseline offset of the exposure tool after adjustment, and compensates the fine-tuning value for the overlay correction parameter for the product accordingly. The exposure tool performs overlay processes on a wafer according to the compensated fine-tuning value for the overlay correction parameter.

23 Claims, 6 Drawing Sheets

EXPOSURE SYSTEM AND METHOD

BACKGROUND

The present disclosure relates generally to an exposure system and method, and particularly to an exposure system and method that compensates fine-tuning values of overlay correction parameters for an adjusted exposure tool in semiconductor manufacturing.

Photolithography is an important technology in semiconductor manufacturing. The number of masks used in photolithography corresponds to the complexity of a manufacturing process. Photolithography affects structures of semiconductor devices, such as patterns of layers and doped regions, and determines the functional effectiveness thereof. Since photolithography is complicated, the exposure tool performing the photolithography can become a bottleneck in the manufacturing process.

Exposure of wafers is implemented in a "Step and Repeat" fashion to transfer high resolution patterns to the wafers. A pattern on the mask is projected and sized to one portion or block of the wafer. This is repeatedly implemented for all blocks on the wafer individually until the entire wafer is exposed. Since only the pattern of one layer is transferred to the wafer after each block is exposed, and there are many patterns of layers and corresponding masks involved in one manufacturing process, piece alignment between the blocks of the wafer, and overlay alignment between the patterns of the layers, are essential to processing. Additionally, performance and baseline of an exposure tool varies slightly with time. For a precise and accurate exposure, the processed wafers are measured to compensate the overlay correction parameters used by the exposure tool. The parameters, once compensated, are used by the exposure tool to process subsequent wafers.

Conventionally, a run to run system calculates fine-tuning values according to the last run of wafers, and compensates the parameters using the fine-tuning values. However, the system is designed for parameter adjustment between lot wafers processed by the exposure tool with time. If the exposure tool encounters malfunction or failure, or undergoes routine maintenance adjustment, the original fine-tuning value for overlay correction is not usable since the equipment baseline is changed by the adjustment. Since there is no effective mechanism of parameter compensation for the adjusted exposure tool, the tuning operation is implemented manually.

FIG. 1 shows an example of conventional fine-tuning value adjustment. Equipment baseline B is gradually shifted with time. Prior to adjustment at time $T_{PM}$, four products are processed by the equipment tool, and corresponding fine-tuning values are $F_1$, $F_2$, $F_3$ and $F_4$. In this case, since the equipment baseline B is shifted by offset d at time $T_{PM}$, each fine-tuning value $F_1$, $F_2$, $F_3$ and $F_4$ is manually adjusted with the offset d as fine-tuning values $AF_1$, $AF_2$, $AF_3$ and $AF_4$. However, since each fine-tuning value is generated based on a different equipment baseline, much of the adjusted fine-tuning value is far from real process conditions or real equipment conditions. Sometimes, pilot wafers are processed by the exposure tool and then measured to obtain the compensation with some approximate calculations.

Since there may be a large number of product types in an IC foundry, conventional parameter compensation can be time-consuming and increase rework rate, thereby resulting in mistakes, and decreasing equipment availability and throughput of the manufacturing process.

SUMMARY

Several embodiments of the present invention are intended to solve the aforementioned issues. It is understood that these embodiments are applicable to any factory, service supplier, and/or product.

Accordingly, it is one object, among others, to provide exposure systems and methods that compensate the fine-tuning values for overlay correction parameters of an adjusted exposure tool in semiconductor manufacturing.

To achieve the above object, the present disclosure provides exposure systems and methods. According to one embodiment of the invention, the exposure system includes a compensation unit and an exposure unit. The compensation unit receives a fine-tuning value for an overlay correction parameter for a product in a first run. The compensation unit further receives an adjustment period, an adjustment time for the exposure tool, and a process time for the product in a second run. The compensation unit also receives an equipment baseline offset of the exposure tool after adjustment, and compensates the fine-tuning value for overlay correction parameter for the product accordingly. The exposure tool performs overlay processes on a wafer according to the compensated fine-tuning value for the overlay correction parameter.

The compensation unit further compensates the fine-tuning value according to an adjustment of a pre-step's equipment tool preceding the exposure tool. It is understood that the pre-step's equipment tool is an equipment tool preceding the exposure tool in processing order.

The compensation unit further compensates the fine-tuning value according to a summation of the offset between compensated fine-tuning values in prior adjustments.

According to another embodiment of the invention, an exposure method is provided. First, a fine-tuning value for an overlay correction parameter for a product in a first run is received. Additionally, an adjustment period, an adjustment time for the exposure tool, and a process time for the product in a subsequent second run are received. Then, an equipment baseline offset of the exposure tool after adjustment is received. Thereafter, the fine-tuning value for the overlay correction parameter for the product is compensated as a function of: the original fine-tuning value, the equipment baseline offset, the adjustment period, the adjustment time, and the process time. Then, overlay processes are performed on a wafer according to the compensated fine-tuning value for the overlay correction parameter.

The fine-tuning value is further compensated according to an adjustment of a pre-step's equipment tool preceding the exposure tool. Similarly, the pre-step's equipment tool is an equipment tool preceding the exposure tool in processing order.

The fine-tuning value is further compensated according to a summation of the offset between compensated fine-tuning values in prior adjustments.

The above-mentioned method may take the form of program code embodied in a tangible medium.

BRIEF DESCRIPTION OF THE DRAWINGS

The aforementioned objects, features and advantages will become apparent by referring to the following detailed description of the preferred embodiment with reference to the accompanying drawings, wherein.

DESCRIPTION

Figure 1:
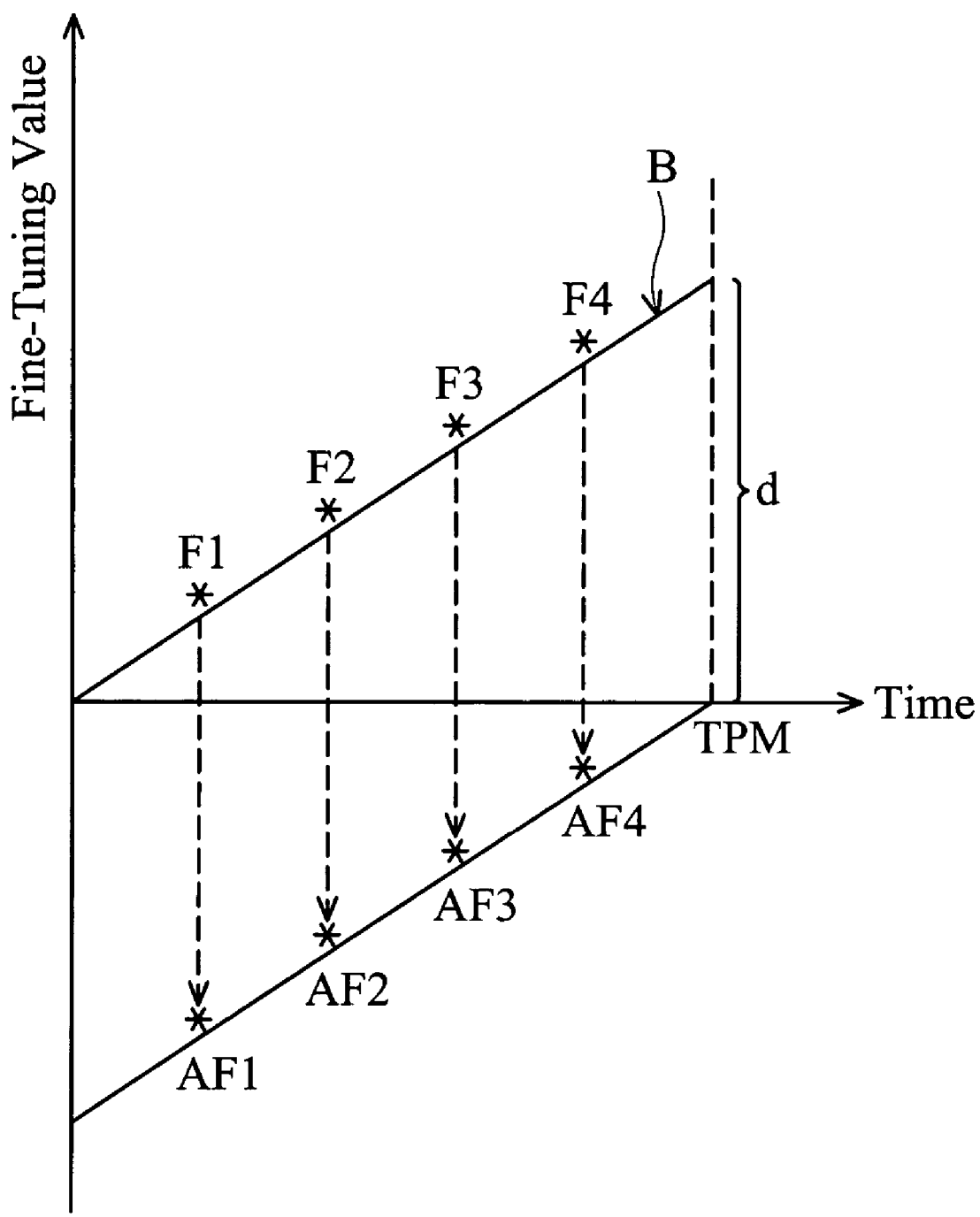
FIG. 1 shows an example of conventional fine-tuning value adjustment.
Figure 2:
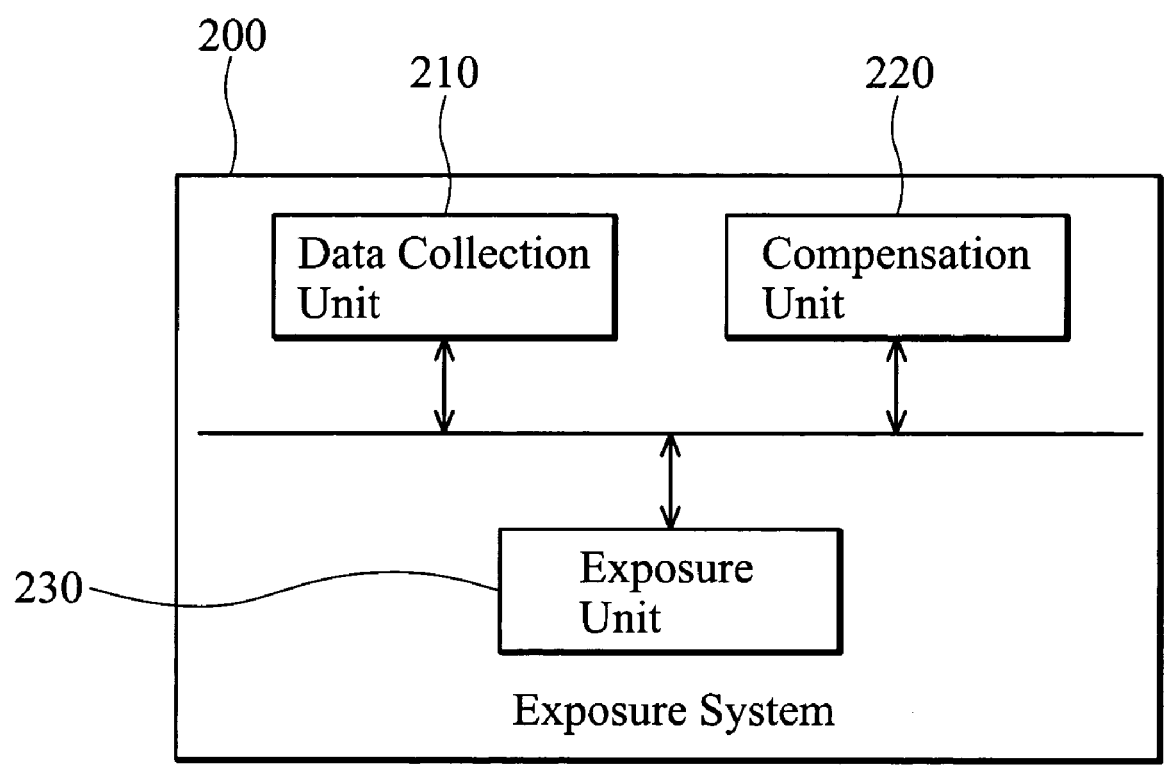
FIG. 2 is a schematic diagram illustrating the architecture of the exposure system according to one embodiment of the present invention.

FIG. 2 is a schematic diagram illustrating the architecture of the exposure system according to one embodiment of the present invention.

The exposure system 200, according to one embodiment of the present invention, includes a data collection unit 210, a compensation unit 220, and an exposure unit 230. The data collection unit 210 retrieves related data. The related data can include, for example, adjustment schedules of respective equipment tools, process time for each product, fine-tuning values for respective products, original and shifted equipment baselines of respective equipment tools, and others from related systems, such as planning or manufacturing execution systems. The compensation unit 220 compensates the fine-tuning value for use by the exposure unit 230. The compensation unit 220 is discussed in greater detail below. The exposure unit 230 performs an overlay process. The overlay process includes piece alignment of blocks and overlay alignment of layers on a wafer. The overlay process is performed according to overlay correction parameters and corresponding fine-tuning values. The exposure unit 230 further performs an exposure process on the wafer.

Figure 3:
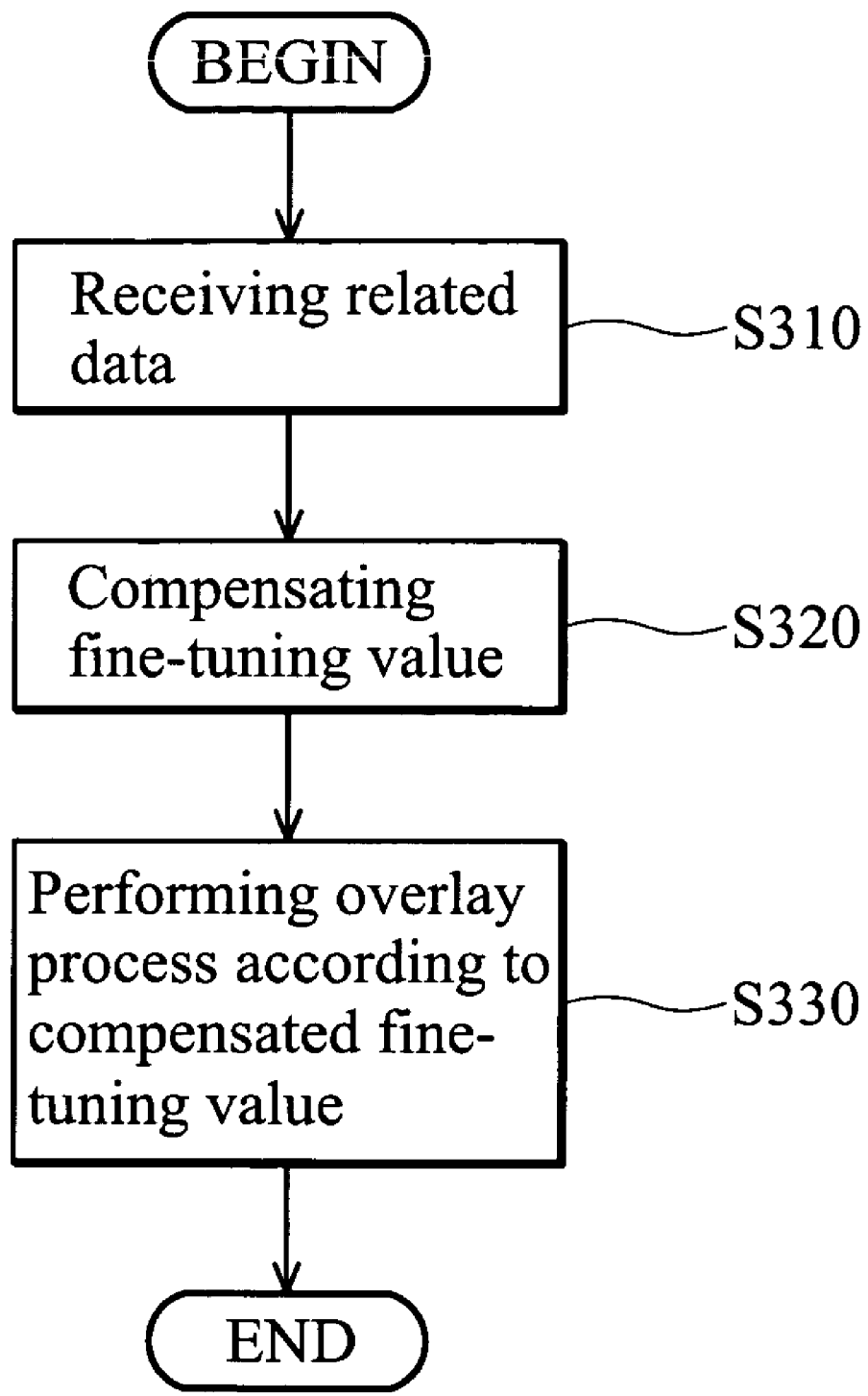
FIG. 3 is a flowchart showing the exposure method according to one embodiment of the present invention.

FIG. 3 shows the exposure method according to one embodiment of the present invention.

First, in step S310, related data is received. The related data can be any combination of: a fine-tuning value for an overlay correction parameter for a product in a first run, an adjustment period for the exposure tool, an adjustment time for the exposure tool, a process time for the product in a second run, and an equipment baseline offset of the exposure tool after adjustment.

Then, in step S320, the compensation unit 220 compensates the fine-tuning value for the overlay correction parameter for the product. The compensation takes into account the original fine-tuning value, the equipment baseline offset, the adjustment period, the adjustment time, and the process time. For some embodiments, the compensation unit 220 compensates the fine-tuning value according to:

$$CET'(F_{n-1}) = CET(F_{n-1}) - \Delta E_c \quad (1),$$

wherein $CET'(F_{n-1})$ is the compensated fine-tuning value, $CET(F_{n-1})$ is the fine-tuning value in the first run, and $\Delta E_c$ is defined as:

$$\Delta E_c = \Delta MS \times \frac{T(CET(F_{n-1})) - T(PM_{i-1})}{T(\text{period})}, \quad (2)$$

wherein $\Delta MS$ is the equipment baseline offset, $T(CET(F_{n-1}))$ is the process time for the product in the first run, $T(PM_{i-1})$ is the adjustment time for the exposure tool in first PM (Preventative Maintenance) or adjustment, and T(period) is the adjustment period for the exposure tool.

Figure 6:
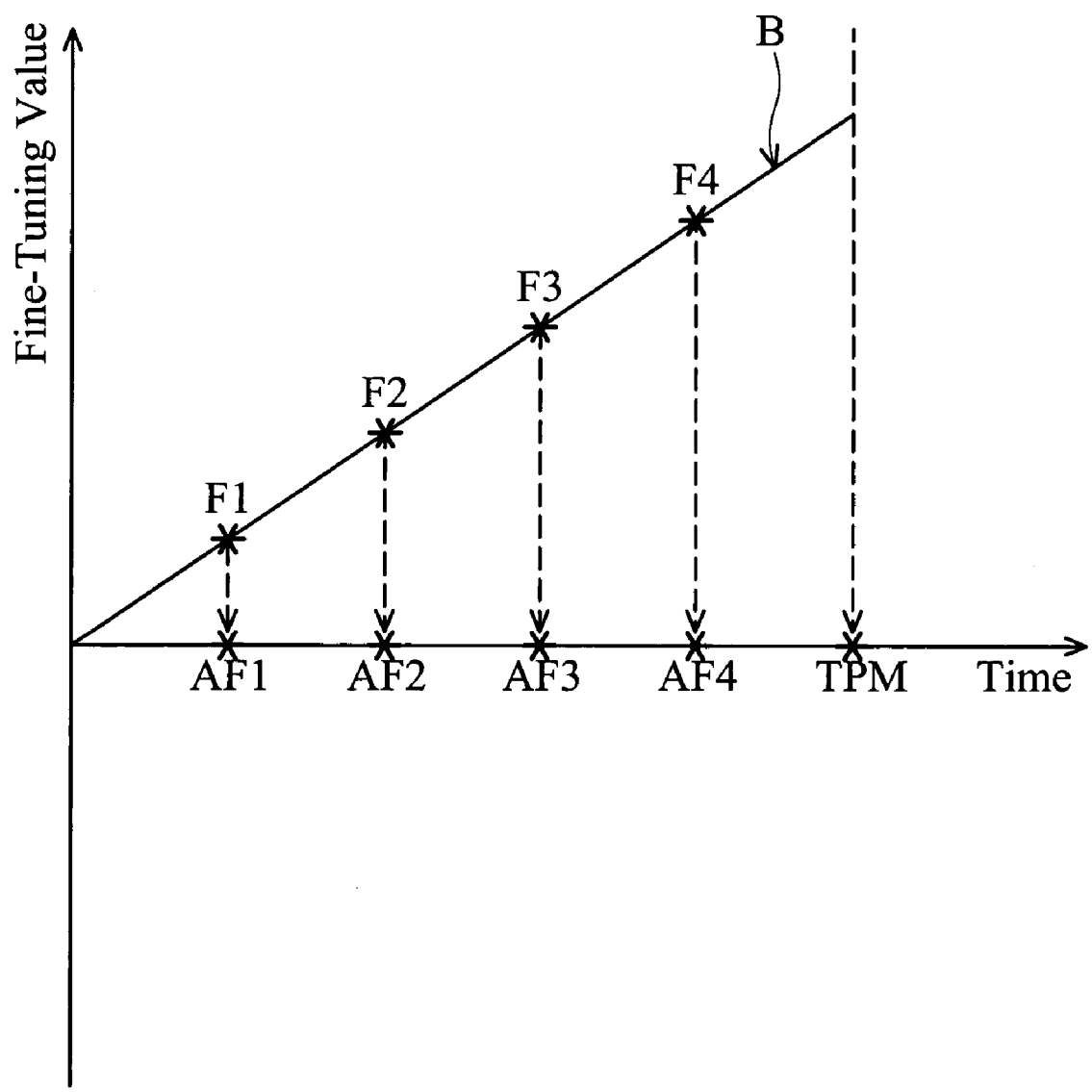
FIG. 6 shows an example of fine-tuning value adjustment according to the present invention.

FIG. 6 shows an example of fine-tuning value adjustment according to the present invention. Similarly, equipment baseline B is gradually shifted with time. Prior to adjustment at time $T_{PM}$, four products are processed by the equipment tool, and corresponding fine-tuning values are $F_1$, $F_2$, $F_3$ and $F_4$. According to the present invention, each fine-tuning value $F_1$, $F_2$, $F_3$ and $F_4$ is automatically adjusted to a new adjusted fine-tuning values $AF_1$, $AF_2$, $AF_3$ and $AF_4$.

Figure 5:
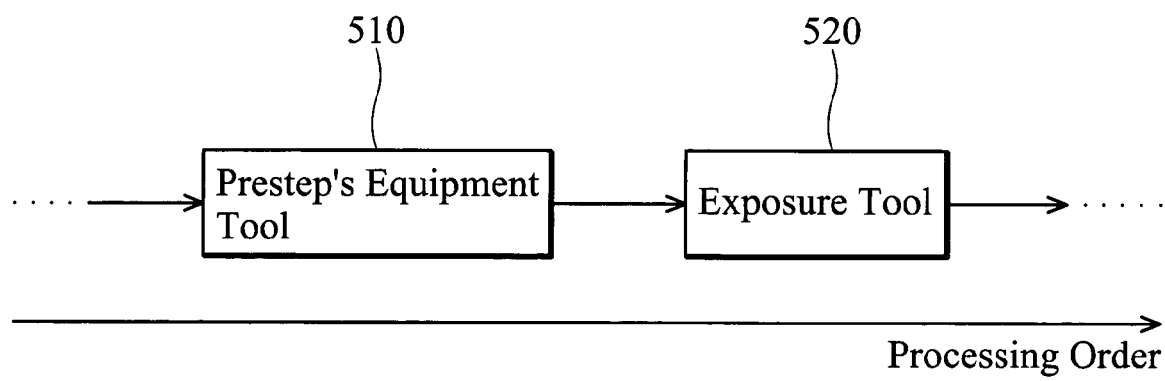
FIG. 5 shows the relationship of a pre-step's equipment tool and an exposure tool.

Formula (1) does not consider the impact of pre-step's equipment tools prior to the exposure tool. The relationship of the pre-step's equipment tool and the exposure tool is shown in FIG. 5. As shown in FIG. 5, the pre-step's equipment tool 510 is an equipment tool preceding the exposure tool 520 in processing order. The pre-step's equipment tool 510 may be another exposure tool or the exposure tool 520. However, if the pre-step's equipment tool is adjusted, the fine-tuning value used in the exposure tool will be impacted. Therefore, in some embodiments, the compensation unit 220 further compensates the fine-tuning value according to adjustments of the pre-step's equipment tool. That compensation takes into account the following factors: a fine-tuning value for the overlay correction parameter for the product in the second run on the pre-step's equipment tool, the equipment baseline offset, the adjustment period, an adjustment time for the pre-step's equipment tool, and a process time for the product in the second run on the pre-step's equipment tool. It is understood that the fine-tuning value for the overlay correction parameter for the product in the second run on the pre-step's equipment tool, the adjustment time for the pre-step's equipment tool, and the process time for the product in the second run on the pre-step's equipment tool can be received in advance. Given these additional factors, the fine-tuning values can be re-written according to:

$$CET'(F_{n-1}) = [CET(F_{n-1}) - \Delta E_c] + \lfloor PET(F_{n-1}) - \Delta E_p \rfloor \quad (3),$$

wherein $PET(F_{n-1})$ is the fine-tuning value in the second run on the pre-step's equipment tool, and $\Delta E_p$ is defined as:

$$\Delta E_p = \Delta MS \times \frac{T(PET(F_{n-1})) - T(PM_{j-1})}{T(\text{period})},$$

wherein $\Delta MS$ is the equipment baseline offset, $T(PET(F_{n-1}))$ is the process time for the product in the second run on the pre-step equipment tool, $T(PM_{j-1})$ is the adjustment time for the pre-step equipment tool, and T(period) is the adjustment period for the exposure tool. It should be understood that various weighting factors may be applied to both $[CET(F_{n-1}) - \Delta E_c]$ and $\lfloor PET(F_{n-1}) - \Delta E_p \rfloor$ for flexible production.

For more precise compensation, the compensation unit 220 further compensates the fine-tuning value considering the prior adjustments and according to a summation of the offset between compensated fine-tuning values in prior adjustments. Thus, given the effect of prior adjustments, the fine-tuning values become:

$$CET'(F_{n-1}) = [CET(F_{n-1}) - \Delta E_c] + \lfloor PET(F_{n-1}) - \Delta E_p \rfloor + \Sigma MBS \quad (4),$$

wherein $\Sigma MBS$ is the summation of the offset between compensated fine-tuning values in prior adjustments.

After the fine-tuning value is compensated, in step S330, the overlay process is performed on a wafer according to the compensated fine-tuning value for the overlay correction parameter.

Figure 4:
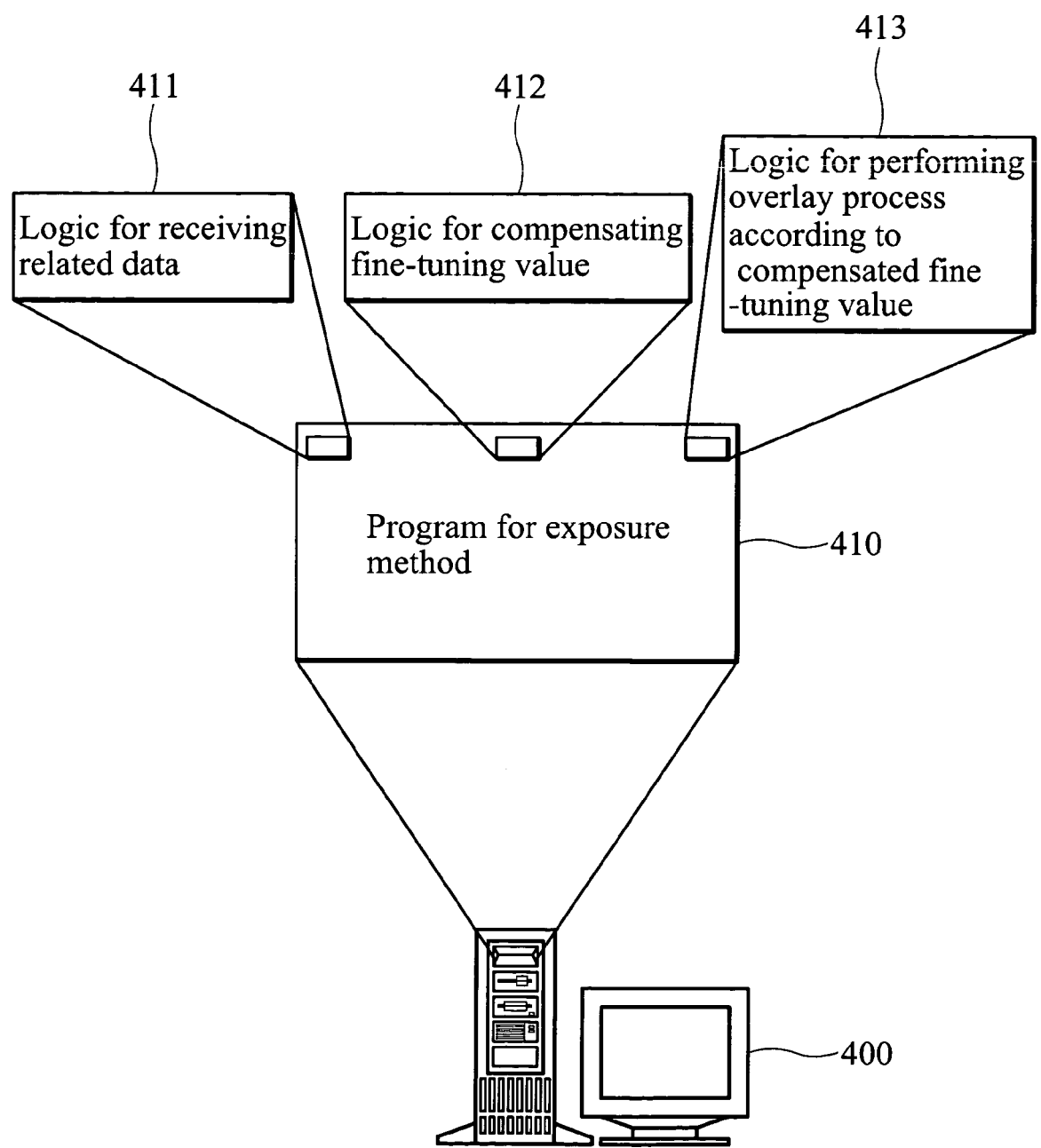
FIG. 4 is a schematic diagram illustrating a storage medium for storing a computer program for execution of the exposure method according to one embodiment of the present invention.

FIG. 4 is a diagram of a storage medium for a computer program providing the exposure method according to one embodiment of the present invention. The computer program product comprises a storage medium 410 having computer readable program code embodied in the medium for use in a computer system 400. The computer readable program code comprises computer readable program code 411 for receiving related data. The related data includes any combination of: a fine-tuning value for an overlay correction parameter for a product in a first run, an adjustment period for the exposure tool, an adjustment time for the exposure tool, a process time for the product in a second run, an equipment baseline offset of the exposure tool after adjustment, a fine-tuning value for the overlay correction parameter for the product in the second run on the pre-step's equipment tool, an adjustment time for the pre-step's equipment tool, a process time for the product in the second run on the pre-step's equipment tool, and others. The program code further comprises computer readable program code 412 for compensating the fine-tuning value for the overlay correction parameter for the product accordingly. Also, for some embodiments, the program code comprises computer readable program code 413 for performing overlay processes on wafers according to the compensated fine-tuning value.

Some embodiments of the present invention thus provides an exposure system and method that automatically compensates fine-tuning values for overlay correction parameters for an adjusted exposure tool in semiconductor manufacturing, such that the adjusted exposure tool can directly perform overlay and exposure processes on wafers, thereby reducing rework rate, and increasing equipment availability and throughput of the manufacturing process.

The methods and systems disclosed herein, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the disclosed method. The methods and systems may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the processor to provide a unique apparatus that operates analogously to application specific logic circuits.

Although several embodiments of the present invention have been described, it is not intended to limit the invention to the precise embodiments disclosed herein. Those skilled in the art can still make various alterations and modifications without departing from the scope and spirit of this invention.

What is claimed is:

1. An exposure system, comprising:
    a compensation unit configured to:
        receive a fine-tuning value for an overlay correction parameter for a product in a first run;
        receive an adjustment period for an exposure tool;
        receive an adjustment time for the exposure tool;
        receive a process time for the product in a second run, the second run being subsequent to the first run;
        receive an equipment baseline offset of the exposure tool after adjustment; and
        compensate the fine-tuning value for the overlay correction parameter for the product according to:
            the original fine-tuning value;
            the equipment baseline offset;
            the adjustment period;
            the adjustment time; and
            the process time; and
    an exposure unit configured to perform overlay processes on a wafer according to the compensated fine-tuning value for the overlay correction parameter.

2. The exposure system of claim 1, wherein the compensation unit compensates the fine-tuning value according to:

$$CET'(F_{n-1}) = CET(F_{n-1}) - \Delta E_c;$$

wherein $CET'(F_{n-1})$ is the compensated fine-tuning value; wherein $CET(F_{n-1})$ is the fine-tuning value in the first run; wherein $$\Delta E_c = \Delta MS \times \frac{T(CET(F_{n-1})) - T(PM_{i-1})}{T(\text{period})};$$

wherein $\Delta MS$ is the equipment baseline offset;
wherein $T(CET(F_{n-1}))$ is the process time for the product in the second run;
wherein $T(PM_{i-1})$ is the adjustment time for the exposure tool in a first preventative maintenance; and
wherein $T(\text{period})$ is the adjustment period for the exposure tool.

3. The exposure system of claim 1, wherein the compensation unit further compensates the fine-tuning value according to an adjustment of a pre-step's equipment tool preceding the exposure tool in processing order.

4. The exposure system of claim 3, wherein the compensation unit compensates the fine-tuning value as a function of:
    a fine-tuning value for the overlay correction parameter for the product in the second run on the pre-step's equipment tool;
    the equipment baseline offset;
    the adjustment period;
    an adjustment time for the pre-step's equipment tool; and
    a process time for the product in the second run on the pre-step's equipment tool.

5. The exposure system of claim 4, wherein the compensation unit compensates the fine-tuning value according to:

$$PET'(F_{n-1}) - \Delta E_p;$$

wherein $PET(F_{n-1})$ is the fine-tuning value in the second run on the pre-step's equipment tool;
wherein $$\Delta E_p = \Delta MS \times \frac{T(PET(F_{n-1})) - T(PM_{j-1})}{T(\text{period})},$$

wherein $\Delta MS$ is the equipment baseline offset;
wherein $T(PET(F_{n-1}))$ is the process time for the product in the second run on the pre-step equipment tool;
wherein $T(PM_{j-1})$ is the adjustment time for the pre-step equipment tool; and wherein T(period) is the adjustment period for the exposure tool.

6. The exposure system of claim 1, wherein the compensation unit further compensates the fine-tuning value according to a summation of the offset between compensated fine-tuning values in prior adjustments.

7. An exposure method, comprising the steps of:
receiving a fine-tuning value for an overlay correction parameter for a product in a first run;
receiving an adjustment period for an exposure tool;
receiving an adjustment time for the exposure tool;
receiving a process time for the product in a second run, the second run being subsequent to the first run;
receiving an equipment baseline offset of the exposure tool after adjustment;
compensating the fine-tuning value for the overlay correction parameter for the product according to:
the original fine-tuning value;
the equipment baseline offset;
the adjustment period;
the adjustment time; and
the process time; and
performing overlay processes on a wafer according to the compensated fine-tuning value for the overlay correction parameter.

8. The exposure method of claim 7, further comprising the step of compensating the fine-tuning value according to:

$$CET'(F_{n-1}) = CET(F_{n-1}) - \Delta E_c;$$

wherein $CET'(F_{n-1})$ is the compensated fine-tuning value;
wherein $CET(F_{n-1})$ is the fine-tuning value in the first run;
wherein $$\Delta E_c = \Delta MS \times \frac{T(CET(F_{n-1})) - T(PM_{i-1})}{T(\text{period})};$$

wherein $\Delta MS$ is the equipment baseline offset;
wherein $T(CET(F_{n-1}))$ is the process time for the product in the second run;
wherein $T(PM_{i-1})$ is the adjustment time for the exposure tool in a first preventative maintenance; and
wherein T(period) is the adjustment period for the exposure tool.

9. The exposure method of claim 7, further comprising the step of compensating the fine-tuning value according to an adjustment of a pre-step's equipment tool preceding the exposure tool in processing order.

10. The exposure method of claim 9, further comprising the step of compensating the fine-tuning value as a function of:
a fine-tuning value for the overlay correction parameter for the product in the second run on the pre-step's equipment tool;
the equipment baseline offset;
the adjustment period;
an adjustment time for the pre-step's equipment tool; and
a process time for the product in the second run on the pre-step's equipment tool.

11. The exposure method of claim 10, further comprising the step of compensating the fine-tuning value according to:

$$PET(F_{n-1}) - \Delta E_p;$$

wherein $PET(F_{n-1})$ is the fine-tuning value in the second run on the pre-step's equipment tool;

wherein $$\Delta E_p = \Delta MS \times \frac{T(PET(F_{n-1})) - T(PM_{j-1})}{T(\text{period})},$$

wherein $\Delta MS$ is the equipment baseline offset;
wherein $T(PET(F_{n-1}))$ is the process time for the product in the second run on the pre-step equipment tool;
wherein $T(PM_{j-1})$ is the adjustment time for the pre-step equipment tool; and
wherein T(period) is the adjustment period for the exposure tool.

12. The exposure method of claim 7, further comprising the step of compensating the fine-tuning value according to a summation of the offset between compensated fine-tuning values in prior adjustments.

13. A machine-readable storage medium storing a computer program which, when executed, directs a computer to perform a method comprising the steps of:
receiving a fine-tuning value for an overlay correction parameter for a product in a first run;
receiving an adjustment period for an exposure tool;
receiving an adjustment time for the exposure tool;
receiving a process time for the product in a second run, the second run being subsequent to the first run;
receiving an equipment baseline offset of the exposure tool after adjustment;
compensating the fine-tuning value for the overlay correction parameter for the product according to:
the original fine-tuning value;
the equipment baseline offset;
the adjustment period;
the adjustment time; and
the process time; and
performing overlay processes on a wafer according to the compensated fine-tuning value for the overlay correction parameter.

14. The storage medium of claim 13, wherein the method further comprises the step of compensating the fine-tuning value according to:

$$CET'(F_{n-1}) = CET(F_{n-1}) - \Delta E_c;$$

wherein $T'(F_{n-1})$ is the compensated fine-tuning value;
wherein $CET(F_{n-1})$ is the fine-tuning value in the first run;
wherein $$\Delta E_c = \Delta MS \times \frac{T(CET(F_{n-1})) - T(PM_{i-1})}{T(\text{period})};$$

wherein $\Delta MS$ is the equipment baseline offset;
wherein $T(CET(F_{n-1}))$ is the process time for the product in the second run;
wherein $T(PM_{i-1})$ is the adjustment time for the exposure tool in a first preventative maintenance; and
wherein T(period) is the adjustment period for the exposure tool.

15. The storage medium of claim 13, wherein the method further comprises the step of compensating the fine-tuning value according to an adjustment of a pre-step's equipment tool preceding the exposure tool in processing order.

16. The storage medium of claim 15, wherein the method further comprises the step of compensating the fine-tuning value as a function of:

a fine-tuning value for the overlay correction parameter for the product in the second run on the pre-step's equipment tool;
the equipment baseline offset;
the adjustment period;
an adjustment time for the pre-step's equipment tool; and
a process time for the product in the second run on the pre-step's equipment tool.

17. The storage medium of claim 16, wherein the method further comprises the step of compensating the fine-tuning value according to:

$$PET(F_{n-1}) - \Delta E_p;$$

wherein $PET(F_{n-1})$ is the fine-tuning value in the second run on the pre-step's equipment tool;
wherein $$\Delta E_p = \Delta MS \times \frac{T(PET(F_{n-1})) - T(PM_{j-1})}{T(\text{period})},$$

wherein $\Delta MS$ is the equipment baseline offset;
wherein $T(PET(F_{n-1}))$ is the process time for the product in the second run on the pre-step equipment tool;
wherein $T(PM_{j-1})$ is the adjustment time for the pre-step equipment tool; and
wherein $T(\text{period})$ is the adjustment period for the exposure tool.

18. The storage medium of claim 13, wherein the method further comprises the step of compensating the fine-tuning value according to a summation of the offset between compensated fine-tuning values in prior adjustments.

19. In a semiconductor manufacturing process with a first run and a second run, a method comprising the steps of:
receiving a fine-tuning value, $CET(F_{n-1})$, for the first run;
receiving an equipment baseline offset, $\Delta MS$;
receiving a process time, $T(CET(F_{n-1}))$, for the second run;
receiving an adjustment time, $T(PM_{i-1})$, for a first preventative maintenance of an exposure tool;
receiving an adjustment period, $T(\text{period})$, for the exposure tool;
compensating the fine-tuning value according to $$CET'(F_{n-1}) = CET(F_{n-1}) - \left( \Delta MS \times \frac{T(CET(F_{n-1})) - T(PM_{i-1})}{T(\text{period})} \right).$$

20. The method of claim 19, further comprising the steps of:
receiving a fine-tuning value, $PET(F_{n-1})$, for the second run on a pre-step's equipment tool preceding the exposure tool in processing order;
receiving a process time, $T(PET(F_{n-1}))$, for the second run on the pre-step's equipment tool;
receiving an adjustment time, $T(PM_{j-1})$, for the pre-step's equipment tool; and
compensating the fine-tuning value for the second run on the pre-step's equipment tool according to $$PET(F_{n-1}) - \left( \Delta MS \times \frac{T(PET(F_{n-1})) - T(PM_{j-1})}{T(\text{period})} \right).$$

21. In a semiconductor manufacturing process with a first run and a second run, an apparatus comprising: means for receiving a fine-tuning value, $CET(F_{n-1})$, for the first run;
means for receiving an equipment baseline offset, $\Delta MS$;
means for receiving a process time, $T(CET(F_{n-1}))$, for the second run;
means for receiving an adjustment time, $T(PM_{i-1})$, for a first preventative maintenance of an exposure tool;
means for receiving an adjustment period, $T(\text{period})$, for the exposure tool;
means for compensating the fine-tuning value according to $$CET'(F_{n-1}) = CET(F_{n-1}) - \left( \Delta MS \times \frac{T(CET(F_{n-1})) - T(PM_{i-1})}{T(\text{period})} \right).$$

22. The apparatus of claim 21, further comprising:
means for receiving a fine-tuning value, $PET(F_{n-1})$, for the second run on a pre-step's equipment tool preceding the exposure tool in processing order;
means for receiving a process time, $T(PET(F_{n-1}))$, for the second run on the pre-step's equipment tool;
means for receiving an adjustment time, $T(PM_{j-1})$, for the pre-step's equipment tool; and
means for compensating the fine-tuning value for the second run on the pre-step's equipment tool according to $$PET(F_{n-1}) - \left( \Delta MS \times \frac{T(PET(F_{n-1})) - T(PM_{j-1})}{T(\text{period})} \right).$$

23. In a semiconductor manufacturing process with a first run and a second run, a compensation unit configured to receive a fine-tuning value for the first run, the compensation unit further being configured to receive an equipment baseline offset, the compensation unit further being configured to receive a process time for the second run, the compensation unit further being configured to receive an adjustment time for the second run, the compensation unit further being configured to receive an adjustment period for an exposure tool, the compensation unit further being configured to compensate the fine-tuning value according to $$CET'(F_{n-1}) = CET(F_{n-1}) - \left( \Delta MS \times \frac{T(CET(F_{n-1})) - T(PM_{i-1})}{T(\text{period})} \right);$$

wherein $CET'(F_{n-1})$ is the compensated fine-tuning value;
wherein $CET(F_{n-1})$ is the fine-tuning value for the first run;
wherein $\Delta MS$ is the equipment baseline offset;
wherein $T(CET(F_{n-1}))$ is the process time for the second run;
wherein $T(PM_{i-1})$ is the adjustment time for a first preventative maintenance of the exposure tool; and
wherein $T(\text{period})$ is the adjustment period for the exposure tool.

* * * * *